US010199454B2

(12) United States Patent
Ogawa et al.

(10) Patent No.: US 10,199,454 B2
(45) Date of Patent: Feb. 5, 2019

(54) SEMICONDUCTOR DEVICE HAVING SCHOTTKY ELECTRODE CONNECTED TO ANODE REGION

(71) Applicant: FUJI ELECTRIC CO., LTD., Kawasaki (JP)

(72) Inventors: Eri Ogawa, Aachen (DE); Akio Nakagawa, Chigasaki (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 4 days.

(21) Appl. No.: 15/170,188

(22) Filed: Jun. 1, 2016

(65) Prior Publication Data

US 2017/0018659 A1 Jan. 19, 2017

(30) Foreign Application Priority Data

Jul. 16, 2015 (JP) .................................. 2015-141832

(51) Int. Cl.
*H01L 29/861* (2006.01)
*H01L 29/06* (2006.01)
*H01L 29/40* (2006.01)

(52) U.S. Cl.
CPC ........ *H01L 29/0619* (2013.01); *H01L 29/402* (2013.01)

(58) Field of Classification Search
CPC ........................ H01L 29/8725; H01L 29/0623
USPC .................................................... 257/77, 139
See application file for complete search history.

(56) References Cited

U.S. PATENT DOCUMENTS

| 5,969,400 A | 10/1999 | Shinohe et al. |
| 6,870,199 B1 | 3/2005 | Yoshikawa et al. |
| 2002/0109200 A1* | 8/2002 | Bartsch ............... H01L 29/24 257/471 |
| 2005/0194610 A1* | 9/2005 | Souma .............. H01L 29/66143 257/133 |
| 2008/0001159 A1* | 1/2008 | Ota ...................... H01L 29/872 257/77 |
| 2009/0090968 A1* | 4/2009 | Ono .................... H01L 29/0619 257/341 |

(Continued)

FOREIGN PATENT DOCUMENTS

| JP | 7-226521 | 8/1995 |
| JP | 8-316480 | 11/1996 |

(Continued)

OTHER PUBLICATIONS

Matsudai, T. et al., "1200V SC(Schottky Controlled Injection)-Diode, An Advanced Fast Recovery Concept with High Carrier Lifetime", *Proceedings of the 25th International Symposium on Power Semiconductor Devices & ICs*, Kanazawa, Japan, 2013, pp. 339-342.

*Primary Examiner* — Matthew L Reames
*Assistant Examiner* — Wilner Jean Baptiste

(57) ABSTRACT

For enhancing a reverse-recovery immunity of a diode element, a semiconductor device includes a first conductivity-type drift layer, a second conductivity-type anode region provided in an upper portion of the drift layer, an insulating film provided on the drift layer, an anode electrode having an ohmic contact portion ohmically contacted to the anode region through a contact hole penetrating the insulating film, and a Schottky electrode Schottky-contacted to a peripheral portion of the anode region.

17 Claims, 14 Drawing Sheets

(56) References Cited

U.S. PATENT DOCUMENTS

| | | | |
|---|---|---|---|
| 2010/0176448 A1* | 7/2010 | Hsieh | H01L 27/0629 257/334 |
| 2010/0207166 A1* | 8/2010 | Zhu | H01L 29/08 257/201 |
| 2010/0207205 A1 | 8/2010 | Grebs et al. | |
| 2011/0140165 A1* | 6/2011 | Kusunoki | H01L 27/0658 257/139 |
| 2013/0168761 A1* | 7/2013 | Hsieh | H01L 29/407 257/330 |
| 2013/0307019 A1 | 11/2013 | Koyama et al. | |
| 2013/0307111 A1* | 11/2013 | Mizushima | H01L 29/0661 257/484 |

FOREIGN PATENT DOCUMENTS

| | | |
|---|---|---|
| JP | 2001-135831 | 5/2001 |
| JP | 2012-518292 | 8/2012 |
| JP | 2014-3271 | 1/2014 |

* cited by examiner

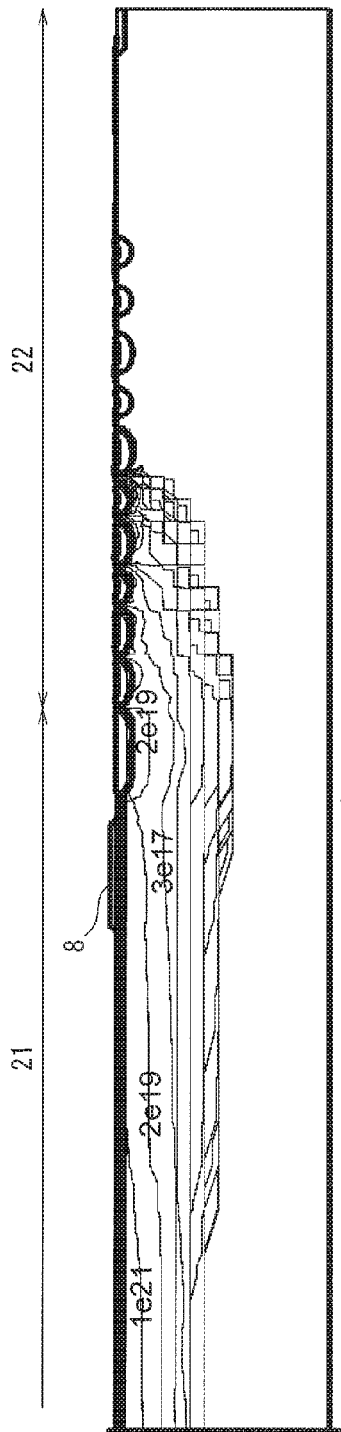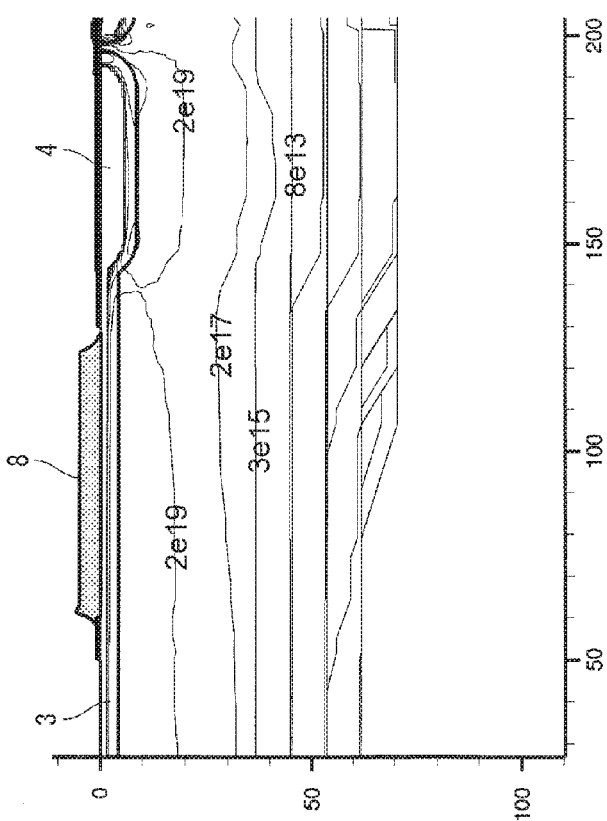
FIG. 7A
FIG. 7B

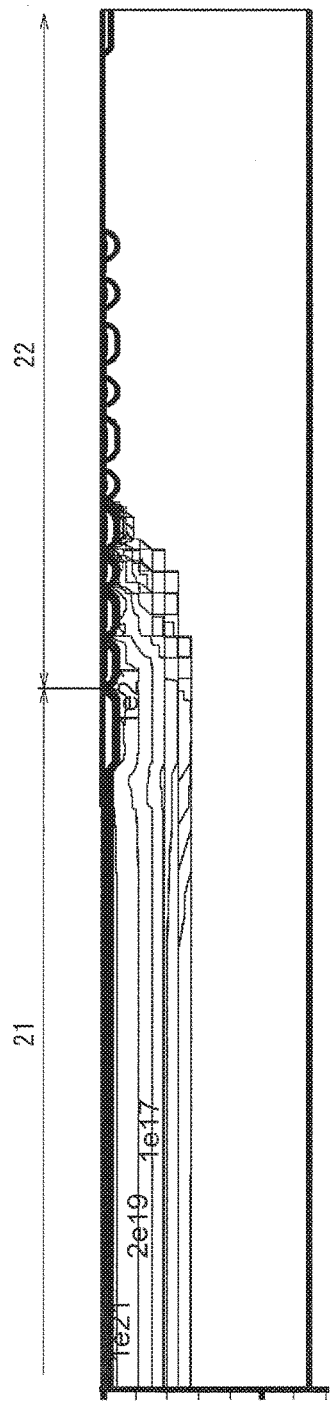
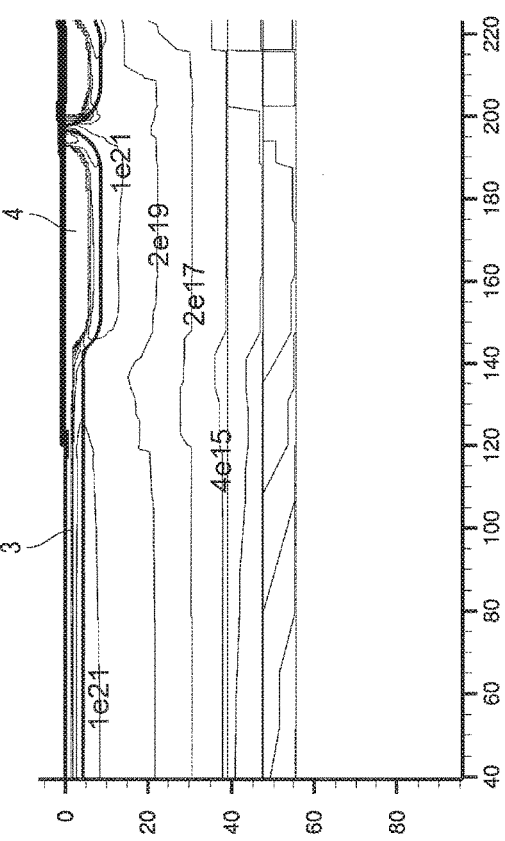
FIG. 8A
FIG. 8B

SEMICONDUCTOR DEVICE HAVING SCHOTTKY ELECTRODE CONNECTED TO ANODE REGION

CROSS-REFERENCE TO RELATED APPLICATIONS

This application claims benefit of priority under 35 USC 119 based on Japanese Patent Application No. 2015-141832 filed Jul. 16, 2015, the entire contents of which are incorporated by reference herein.

BACKGROUND

The present invention relates to semiconductor devices, and particularly relates to a technology effective for application to semiconductor devices including a diode element.

A power diode element is used by being connected in anti-parallel to switching elements, which include an insulated gate bipolar transistor (IGBT) and an insulated gate field effect transistor (IGFET) such as MOSFET. It is apprehended that, depending on operation conditions, the power diode element may be broken down if a temporal variation (di/dt) of a current, when a direction of the current turns from a forward direction to a reverse direction at a time of the recovery, becomes extremely large. Therefore, in general, the power diode element is required to have a large value of di/dt for preventing from being broken down, that is, the power diode element is required to have a large destruction immunity during reverse recovery (hereinafter called "reverse-recovery immunity").

However, in view of predisponency such that a reverse recovery di/dt for the reverse-recovery immunity increases year by year, it is apprehended that the power diode element may be broken down by a current concentration in a peripheral edge portion of an ohmic contact portion in which an anode electrode is contacted to an anode region, and that the break down of the power diode element may be increased by an electric field density in an outer curvature portion that becomes a side surface of the anode region. Accordingly, it is important to enhance the reverse-recovery immunity.

JP 2014-3271A discloses a scheme of providing a p-type annular diffusion region, being contact with a p-type anode diffusion region, on an outside of the anode diffusion region. Because the annular diffusion region is deeper than a p-type anode region, the electric field density in the outer curvature portion, which is the side surface of the annular diffusion region, is relaxed to enhance the reverse-recovery immunity.

It is an object of the present invention to provide a new semiconductor device capable of enhancing the reverse-recovery immunity of the diode element.

SUMMARY

In order to achieve the foregoing object, a semiconductor device according to an embodiment of the present invention includes: a first conductivity-type drift layer; a second conductivity-type anode region provided in an upper portion of the drift layer; an insulating film provided on the drift layer; an anode electrode having an ohmic contact portion ohmically contacted to the anode region through a contact hole penetrating the insulating film; and a Schottky electrode Schottky-contacted to a peripheral portion of the anode region. Furthermore, a semiconductor device according to another embodiment of the present invention includes: a first conductivity-type drift layer; a second conductivity-type anode region provided in an upper portion of the drift layer; an insulating film provided on the drift layer; an anode electrode including an ohmic contact portion ohmically contacted to the anode region through a contact hole penetrating the insulating film; a second conductivity-type extraction region provided in contact with the anode region, surrounding the anode region and being disposed deeper than the anode region; and a Schottky electrode Schottky-contacted to the extraction region.

BRIEF DESCRIPTION OF THE DRAWINGS

FIG. 5A is a cross-sectional distribution profile at a position corresponding to FIG. 3, and FIG. 5B is a cross-sectional distribution profile in which a part of FIG. 5A is enlarged.

FIG. 6A is a cross-sectional distribution profile at a position corresponding to FIG. 3, and FIG. 6B is a cross-sectional distribution profile in which a part of FIG. 6A is enlarged.

FIGS. 7A and 7B are views illustrating impact ionization rate distributions at a time of recovery, which are obtained by simulations, in the semiconductor device according to the first embodiment of the present invention. FIG. 7A is a cross-sectional distribution profile at a position corresponding to FIG. 3, and FIG. 7B is a cross-sectional distribution profile in which a part of FIG. 7A is enlarged.

FIGS. 8A and 8B are views illustrating impact ionization rate distributions at the time of the recovery, which are obtained by simulations, in the conventional semiconductor device. FIG. 8A is a cross-sectional distribution profile at a position corresponding to FIG. 3, and FIG. 8B is a cross-sectional distribution profile in which a part of FIG. 8A is enlarged.

DETAILED DESCRIPTION OF THE INVENTION

Figure 1:
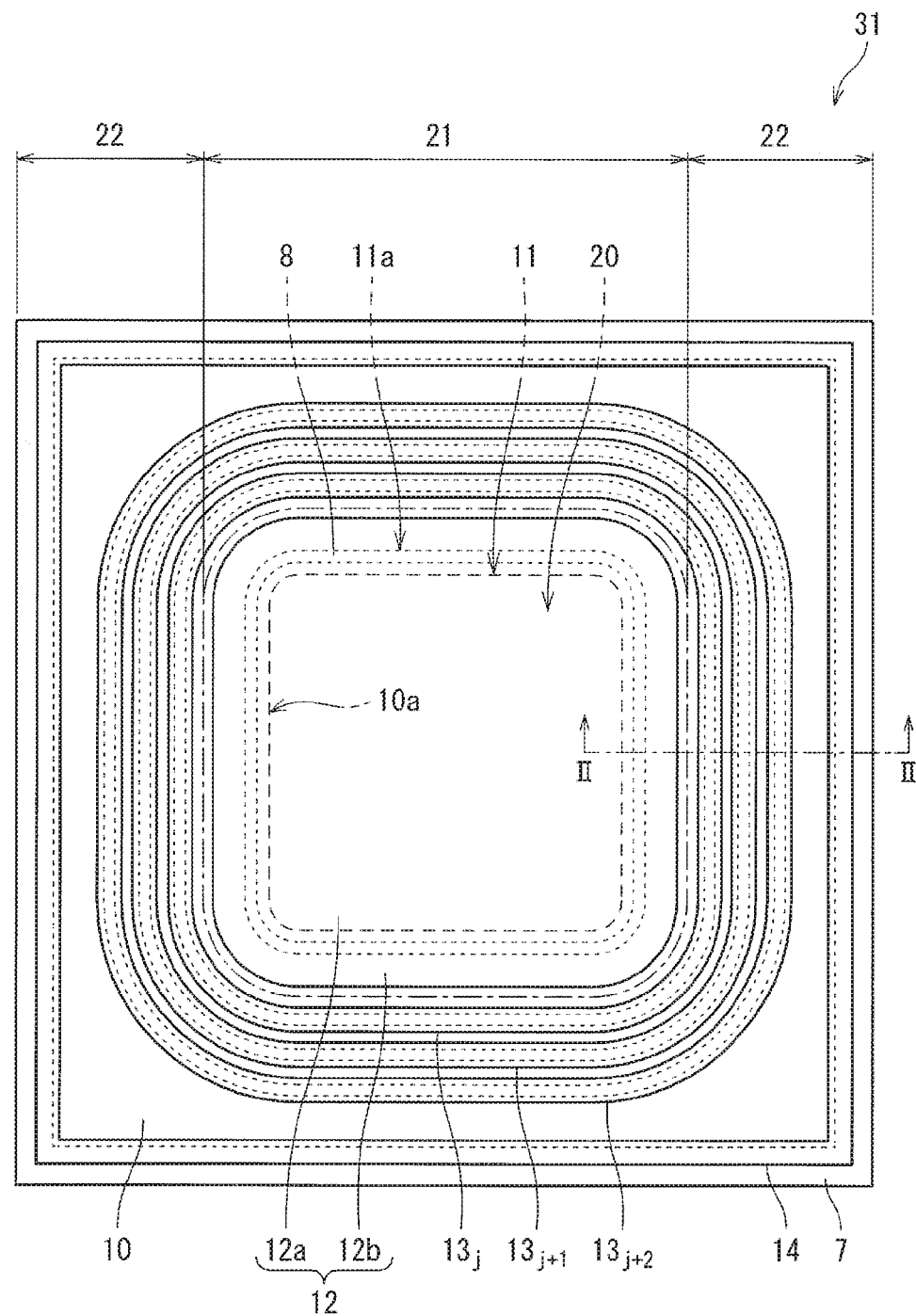
FIG. 1 is a chip layout view of a semiconductor device according to a first embodiment of the present invention.

With reference to the drawings, semiconductor devices according to first to fourth embodiments of the present invention will be explained in detail below. In this specification and the accompanying drawings, in layers and regions denoted by n and p, electrons and holes are assigned as the majority carriers, respectively. Moreover, + and −, which are added as superscripts to n and p, stand for semiconductor regions having impurity concentrations relatively higher and lower than the semiconductor regions which are not added with + and −, respectively. Furthermore, the terms of an "upper surface" and a "lower surface" in the following description shall be read to be defined only in the illustrated cross-sectional views. For example, when the orientation of the semiconductor device is changed by 90°, then naturally, such assignments of "upper" and "lower" shall be turned to "left" and "right", and when the orientation of the semiconductor device is changed by 180°, then naturally, a relationship between the "upper" and "lower" shall be reversed.

Note that, in the following description and accompanying drawings of the first to fourth embodiments, the same reference numerals are assigned to similar elements, and a duplicate description is omitted. Moreover, for facilitating viewing or understanding, the accompanying drawings described in the first to fourth embodiments are not drawn in accurate scale and dimensional ratio. The technical scope of the present invention is not limited to the description of the first to fourth embodiments, which are described below, without departing from the spirit of the present invention prescribed by claims. Moreover, in FIG. 1, FIG. 3, FIG. 10 and FIG. 12 to FIG. 14, illustration of upper layers on and above an anode electrode is omitted for making it easy to view the structures.

First Embodiment

<<Structure of Semiconductor Device>>

Figure 2:
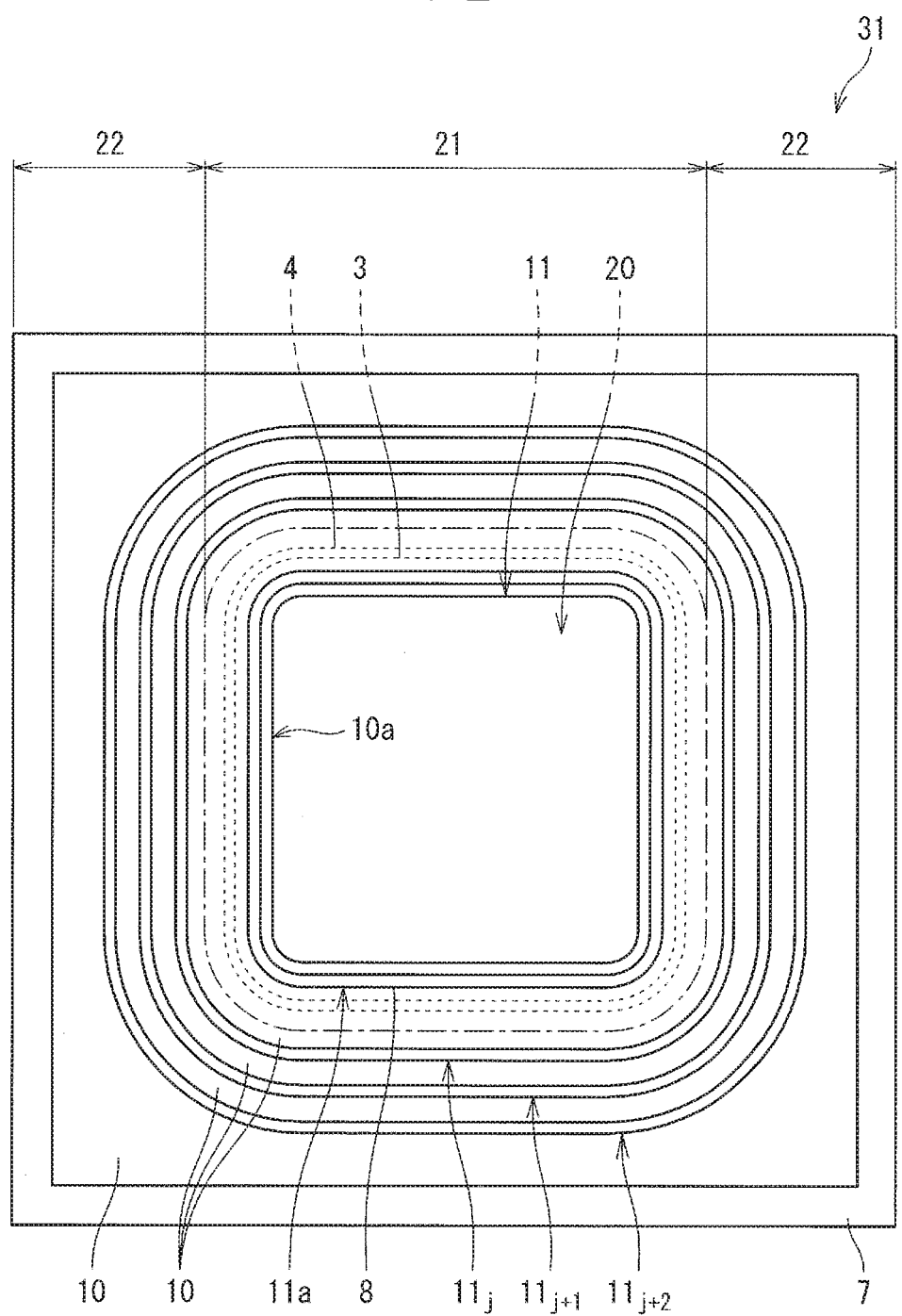
FIG. 2 is a chip layout view in a state where illustration of an anode electrode and an FLR electrode, which are illustrated in FIG. 1, is omitted.
Figure 3:
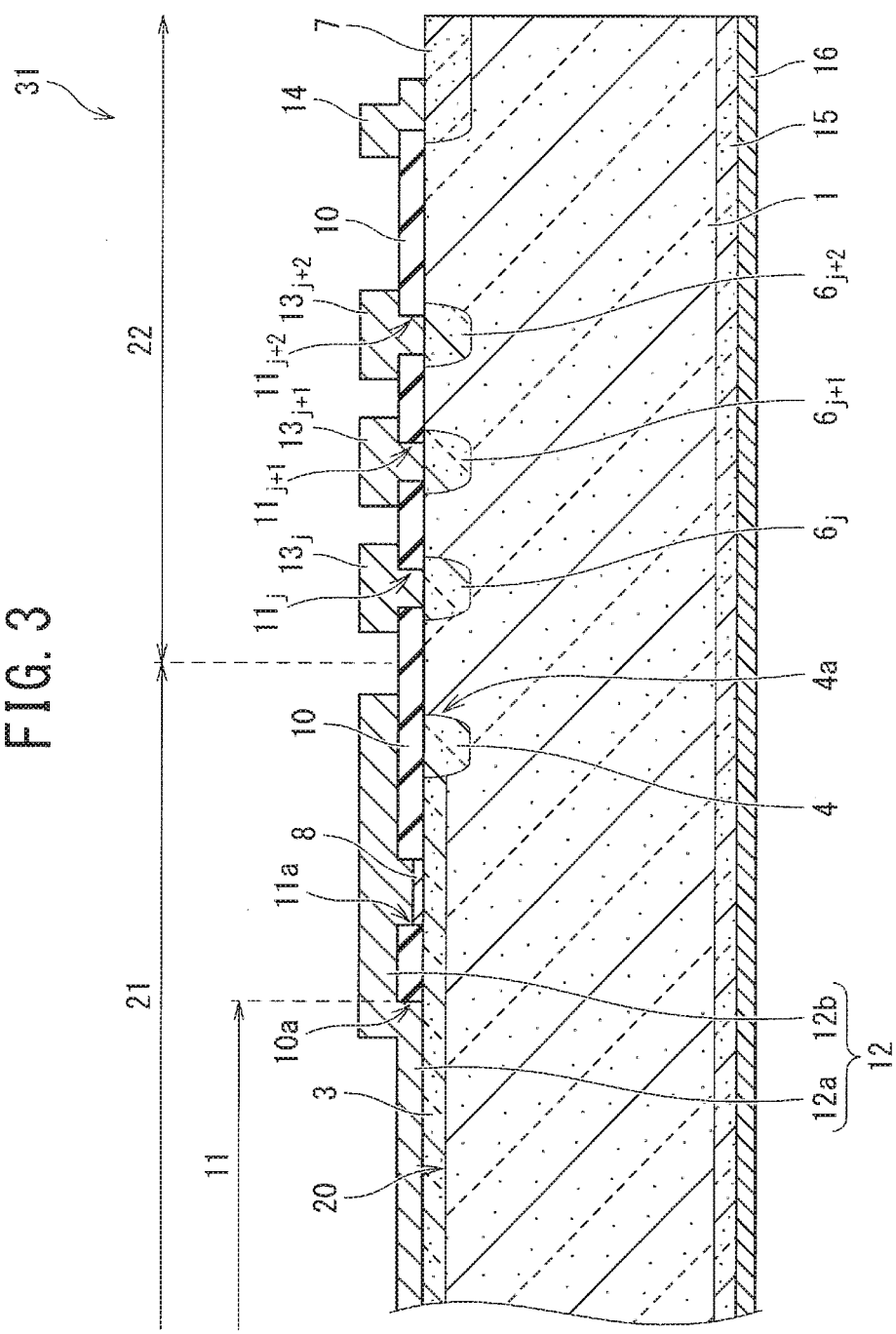
FIG. 3 is a main portion cross-sectional view illustrating a cross-sectional structure taken along a line II-II in FIG. 1.

In a semiconductor device 31 according to the first embodiment of the present invention, as illustrated in FIG. 3, a first conductivity-type (n⁻-type) drift layer 1 is implemented by a semiconductor substrate made, for example, of monocrystalline silicon. As understood from plan views illustrated in FIG. 1 and FIG. 2, the drift layer 1 includes an active-element arrangement area 21 located on a center, and an contour-termination region (breakdown-voltage-improving region) 22 provided so as to surround the active-element arrangement area 21. In the active-element arrangement area 21, a power diode element 20 is disposed. Though a structure is not limited to that illustrated in FIG. 3, in the contour-termination region 22, triple second conductivity-type (p⁺-type) field limiting ring (FLR) regions $6_j$, $6_{j+1}$ and $6_{j+2}$, which are floating regions, are provided in a triplefold manner so as to surround the active-element arrangement area 21.

As illustrated in FIG. 3, the semiconductor device 31 according to the first embodiment of the present invention includes the drift layer 1, a second conductivity-type (p-type) anode region 3 selectively provided on one main surface (hereinafter, defined as an "upper surface") side of the drift layer 1, and an insulating film 10 provided on the drift layer 1. As understood from the plan view of FIG. 2, the anode region 3 is implemented by a square plane pattern.

Moreover, as illustrated in FIG. 3, the semiconductor device 31 according to the first embodiment includes an anode electrode 12 having an ohmic contact portion 12a and an extension portion 12b. The ohmic contact portion 12a is ohmically contacted to the anode region 3 through a contact hole 11 that penetrates the insulating film 10. The pattern of the extension portion 12b is delineated to pull out the electrical path from the ohmic contact portion 12a to a periphery of the ohmic contact portion 12a. As understood from the plan view of FIG. 2, the contact hole 11 is implemented by a square plane pattern. As illustrated in FIG. 3, the ohmic contact portion 12a of the anode electrode 12 is embedded in an inside of the contact hole 11, and as understood from FIG. 1, is delineated as a square plane pattern in a similar way to the contact hole 11. As illustrated in FIG. 1 and FIG. 3, the extension portion 12b of the anode electrode 12 is merged integrally with the ohmic contact portion 12a so as to surround the ohmic contact portion 12a and the contact hole 11. Moreover, the extension portion 12b is mainly disposed on the insulating film 10.

Moreover, as illustrated in FIG. 3, the semiconductor device 31 according to the first embodiment includes a Schottky-barrier electrode (hereinafter called "Schottky electrode") 8 Schottky-contacted to a peripheral portion of the anode region 3. The Schottky electrode 8 is disposed between the anode region 3 and the extension portion 12b of the anode electrode 12 so as to be connected to the extension portion 12b of the anode electrode 12. The Schottky electrode is electrically and metallurgically connected to the extension portion 12b of the anode electrode 12.

As illustrated in FIG. 3, the semiconductor device 31 according to the first embodiment includes a second conductivity-type (p⁺-type) extraction region 4, which is provided in contact with the anode region 3 so as to surround the anode region 3, and is disposed deeper than the anode region 3. As understood from the plan view of FIG. 2, the extraction region 4 is delineated as an annular plane pattern extending annularly so as to surround the anode region 3.

Moreover, as illustrated in FIG. 3, the semiconductor device 31 according to the first embodiment includes a first conductivity-type (n⁺-type) cathode region 15 and a cathode electrode 16. The cathode region 15 is provided under other main surface (hereinafter, defined as a "back surface") side of the drift layer 1 so as to cover the active-element arrangement area 21 and the contour-termination region 22. The cathode electrode 16 is provided on the back surface of the drift layer 1 so as to cover the active-element arrangement area 21 and the contour-termination region 22. The cathode electrode 16 is electrically and metallurgically connected to the cathode region 15 so as to make a low ohmic contact resistance with the cathode region 15.

Moreover, as illustrated in FIG. 3, the semiconductor device 31 according to the first embodiment includes the diode element 20 disposed in the active-element arrangement area 21, and the triple FLR regions $6_j$, $6_{j+1}$ and $6_{j+2}$, which are provided in the contour-termination region 22. The diode element 20 mainly includes the drift layer 1, the anode region 3 and the cathode region 15, which are mentioned above.

As illustrated in FIG. 1 to FIG. 3, the triple FLR regions $6_j$, $6_{j+1}$ and $6_{j+2}$ are individually delineated as annular plane patterns, which are extending annularly apart from the extraction region 4 of the diode element 20, so as to surround the extraction region 4 on the upper surface of the drift layer 1.

As illustrated in FIG. 3, through FLR contact holes $11_j$, $11_{j+1}$ and $11_{j+2}$ penetrating the insulating film 10, FLR electrodes $13_j$, $13_{j+1}$ and $13_{j+2}$ are electrically and metallurgically connected respectively to the FLR regions $6_j$, $6_{j+1}$ and $6_{j+2}$ so as to each make a low ohmic contact resistance. As illustrated in FIG. 1 and FIG. 2, the FLR electrodes $13_j$, $13_{j+1}$ and $13_{j+2}$ and the FLR contact holes $11_j$, $11_{j+1}$ and $11_{j+2}$ are delineated as annular plane patterns extending annularly so as to surround the anode region 3 and the anode electrode 12.

As illustrated in FIG. 2 and FIG. 3, surrounding the FLR regions $6_j$, $6_{j+1}$ and $6_{j+2}$ on an upper surface side of the drift layer 1, a first conductivity-type (n-type) well region 7 is provided apart from the FLR regions $6_j$, $6_{j+1}$ and $6_{j+2}$. To the well region 7, a well electrode 14 with an annular plane pattern extending annularly so as to surround the FLR regions $6_j$, $6_{j+1}$ and $6_{j+2}$ is electrically and metallurgically connected so as to make a low ohmic contact resistance.

The insulating film. 10 is made, for example, by a silicon oxide film. The anode electrode 12, the FLR electrodes $13_j$, $13_{j+1}$ and $13_{j+2}$ and the well electrode 14 are made, for example, by an aluminum (Al) film or an aluminum alloy film of aluminum/silicon (Al—Si), aluminum/copper (Al—Cu), aluminum/copper/silicon (Al—Cu—Si) or the like. The cathode electrode 16 is made, for example, by a gold (au) film.

A surface carrier concentration of the extraction region 4 is made higher than a surface carrier concentration of the anode region 3. Moreover, the extraction region 4 is formed, for example, in the same step as that of the FLR regions $6_j$, $6_{j+1}$ and $6_{j+2}$, and has a surface carrier concentration similar to that of the FLR regions $6_j$, $6_{j+1}$ and $6_{j+2}$. The surface carrier concentration of the extraction region 4 is, for example, $1.0 \times 10^{18}$ to $1.0 \times 10^{19} / cm^3$, and the surface carrier concentration of the anode region 3 is, for example, $1.0 \times 10^{16}$ to $1.0 \times 10^{17} / cm^3$.

The Schottky electrode 8 is made by a metallic film having a Schottky-barrier height higher than the anode electrode 12. In the first embodiment of the present invention, the anode electrode 12 is made by the Al film or the Al alloy film, and accordingly the Schottky electrode 8 is made, for example, by a platinum (Pt) film having a Schottky-barrier height higher than the Al film or the Al alloy film.

As illustrated in FIG. 3, the Schottky electrode 8 is embedded in an inside of a through hole 11a penetrating the insulating film 10. As illustrated in FIG. 1 and FIG. 2, the Schottky electrode 8 and the through hole 11a surround the ohmic contact portion 12a of the anode electrode 12 so as to implement annular plane patterns extending annularly. Moreover, as illustrated in FIG. 3, the Schottky electrode 8 and the through hole 11a are provided apart from the peripheral edge portion of the contact hole 11 for the ohmic contact portion 12a of the anode electrode 12, in other words, an end portion 10a of the insulating film 10, which serves as a contour of the ohmic contact portion 12a. Moreover, a thickness of the Schottky electrode 8 may be thinner than that of the insulating film 10, and a thickness of the anode electrode 12 may be thicker than that of the insulating film 10.

As understood from FIG. 1 to FIG. 3, the annular pattern of the Schottky electrode 8 extends continuously on the anode region 3, for example, so as to surround the ohmic contact portion 12a of the anode electrode 12, and is ohmically contacted to the anode region 3 continuously.

As understood from FIG. 1 to FIG. 3, the anode region 3 has an asset size smaller than an asset size of the whole of the anode electrode 12 and larger than a plane size of the ohmic contact portion 12a of the anode electrode 12. That is to say, the anode region 3 is provided to cover an area from such a portion immediately under the ohmic contact portion 12a of the anode electrode 12 to a portion immediately below the extension portion 12b of the anode electrode 12, and between the extension portion 12b and the anode region 3, the insulating film 10 is interposed except for the through hole 11a that is a forming region of the Schottky electrode 8.

Figure 4:
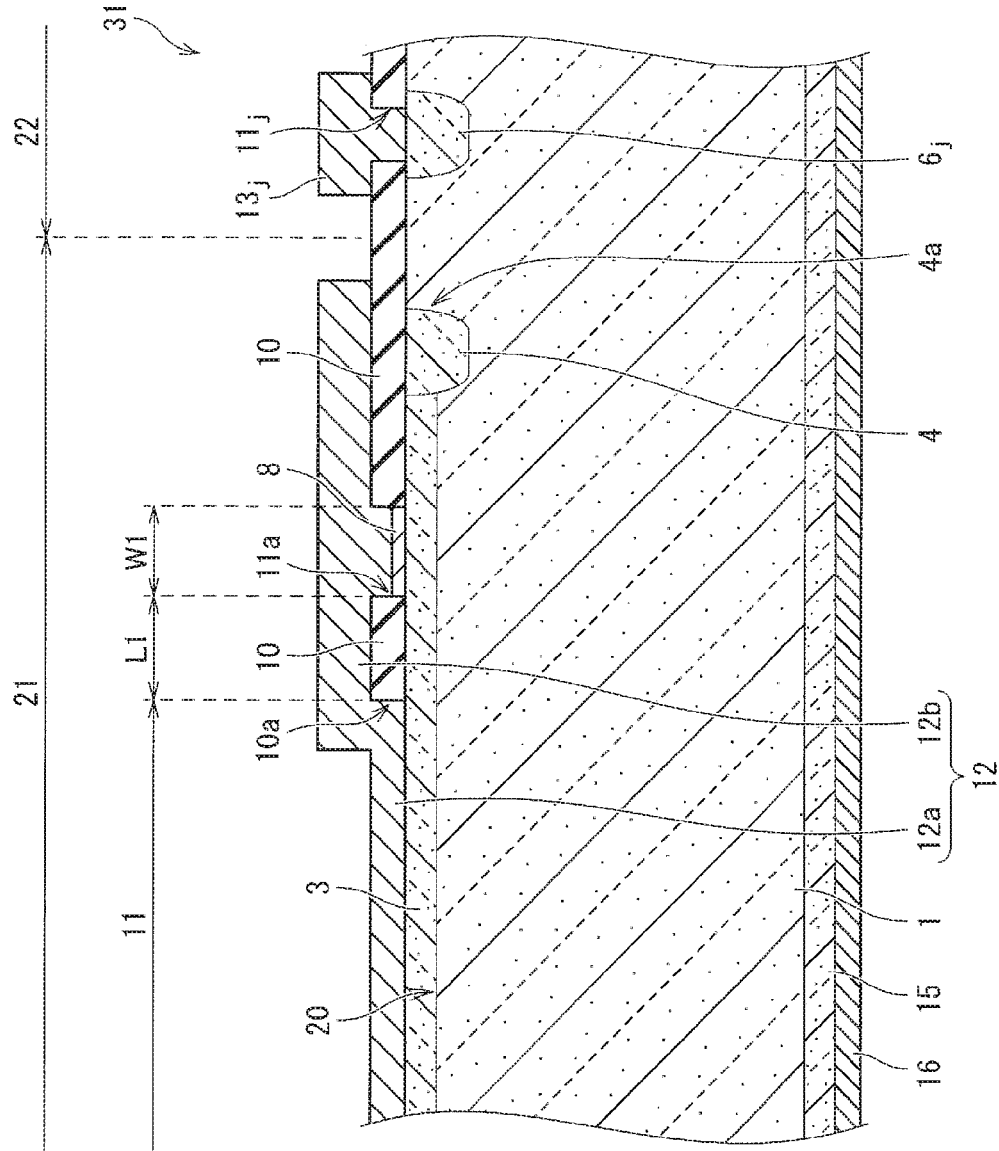
FIG. 4 is a main portion cross-sectional view in which a part of FIG. 3 is enlarged.

As illustrated in FIG. 3 and FIG. 4, the extraction region 4 is provided immediately below the extension portion 12b apart from the peripheral edge portion (end portion 10a of the insulating film) of the ohmic contact portion 12a of the anode electrode 12, and apart from the Schottky electrode 8. That is to say, as understood from the plan views of FIG. 1 and FIG. 2, the Schottky electrode 8 is provided between the peripheral edge portion of the ohmic contact portion 12a of the anode electrode 12 and the extraction region 4 so as to be spaced apart from each of the ohmic contact portion 12a and the extraction region 4.

As illustrated in FIG. 4, if a distance L1 from the peripheral edge portion of the ohmic contact portion 12a of the anode electrode 12 to the Schottky electrode 8 is too long, then the extraction of the carriers (holes in this case) at the time of the recovery is performed mostly in the ohmic contact portion. Accordingly, the distance L1 may be set within a range of 0.5 µm to 15 µm. Moreover, if a width W1 of the Schottky electrode 8 (that is, a width along a direction perpendicular to the extending direction on the same plane) is too short, then an extraction effect of the carriers at the time of the recovery is lowered, and if the width is longer, then a device length becomes too large. Accordingly, it is preferable to set the width within a range of 40 µm to 70 µm.

<<Operation of Semiconductor Device>>

Next, with reference to FIG. 4, operations of the semiconductor device 31 according to the first embodiment will be explained.

First, when the diode element 20 is forward biased, and a potential of the p-type anode region 3 exceeds a diffusion potential (built-in potential) of a pn junction between the anode region 3 and the n⁻-type drift layer 1, holes serving as minority carriers are injected from the anode region 3 into the drift layer 1. As a result, in the drift layer 1, there occurs the conductivity modulation corresponding to the density of the hole carriers highly injected, and the electron carrier (majority carrier) density is increased. Accordingly, as seen in the well-known forward I-V curve of the diode, the diode element 20 exhibits forward characteristics, in which a forward resistance is sharply decreased, and a forward current is sharply increased.

Next, when the diode element 20 is reverse biased, then the holes of minority carriers remaining in the drift layer 1 are recombined with the electrons of majority carriers, and the holes are swept to the anode (negative electrode) side, and thereafter, a depletion layer spreads in the drift layer 1. When the depletion layer finishes spreading, the diode element 20 turns to a cutoff state, and a process until the diode element 20 reaches the cutoff state is called "reverse recovery". Such a carrier sweeping process at this time of the reverse recovery is called a reverse recovery current from a macro-viewpoint, and is in a state where a current flows transiently in spite of the reverse bias. A peak current of the reverse recovery current is increased as a current reduction rate in an event where the diode element 20 turns from the forward direction to the reverse direction is larger. Such an increase of the peak current is also referred to as hard trigger.

The holes of minority carriers are crowd to an outer curved surface portion 4a of the extraction region 4 in an event of extraction (or swept) from the anode electrode 12 that is the negative electrode side at a time of reverse bias. In a case where the extraction region 4 is not provided, the holes of minority carriers are crowd at a curved surface portion that is a side surface of the anode region 3. A reason of the hole-crowding is that, in the outer curved surface portion 4a, both of a current density and a field intensity are increased since equipotential lines, due to electric fields generated by the reverse bias, become locally dense, and it becomes easy to increase the electric field. In particular, the electric field is increased in a case where the current reduction rate, when the diode element 20 turns from the forward direction to the reverse direction, is large.

Moreover, another reason why the current at the time of the reverse recovery crowds to the outer curved surface portion 4a of the extraction region 4 is that, at the time of forward bias supply, a large number of the holes of minority carriers are present not only in a lower portion of the active-element arrangement area 21 but also in a lower portion of the contour-termination region 22 that surrounds the active-element arrangement area 21. At the time of the reverse recovery, the minority carriers in the contour-termination region 22 are attracted to the extraction region 4 by the electric field that is locally increased, whereby the current crowds at the outer curved surface portion 4a of the extraction region 4. A reason why a large number of minority carriers are present also in the lower portion of the contour-termination region 22 is that, at the time of the forward bias supply, the holes are injected also from the anode region 3 immediately below the extension portion 12b of the anode electrode 12, and the holes flow to the contour-termination region 22 side.

<<Technical Advantages of Semiconductor Device>>

Next, a description is made of effectiveness of the semiconductor device 31 according to the first embodiment in comparison with a conventional semiconductor device.

Figure 5A:
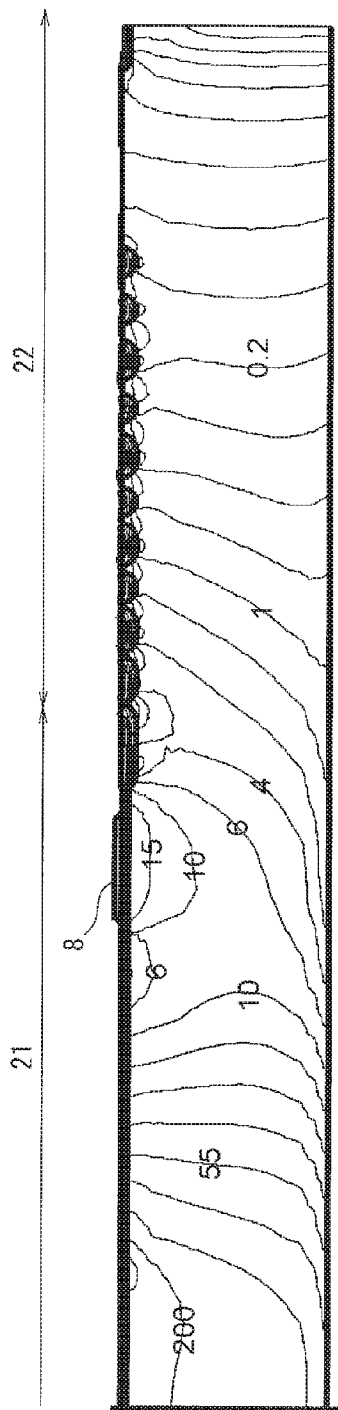
FIGS. 5A and 5B are views illustrating hole current density distributions in ON state, which are calculated by simulations in the semiconductor device according to the first embodiment of the present invention.
Figure 5B:
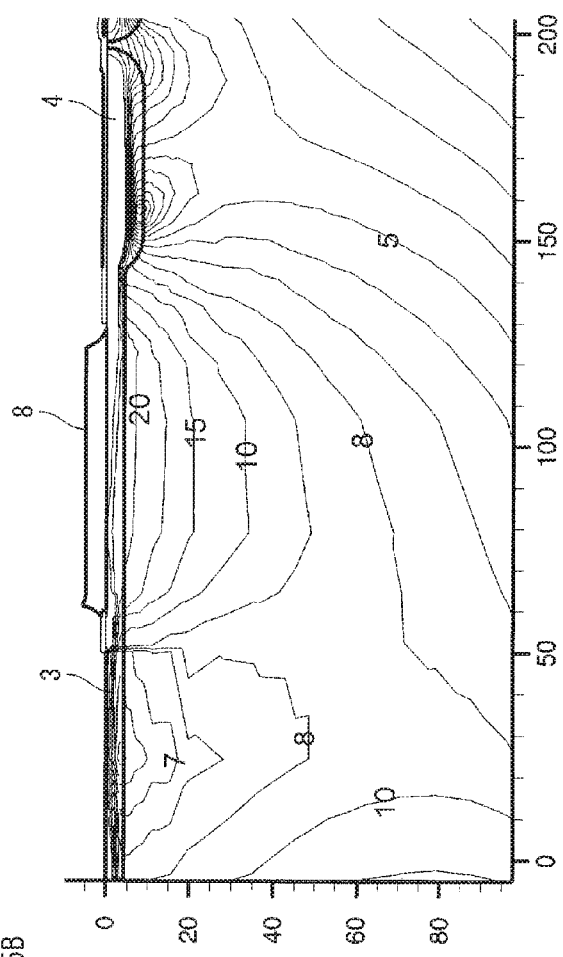
Figure 6A:
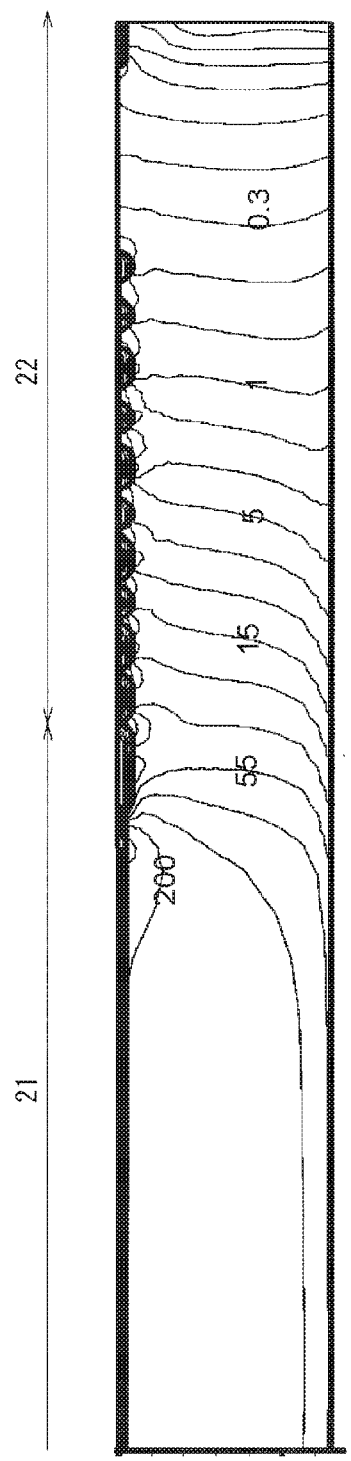
FIGS. 6A and 6B are views illustrating hole current density distributions in ON state, which are calculated by simulations in a conventional semiconductor device.
Figure 6B:
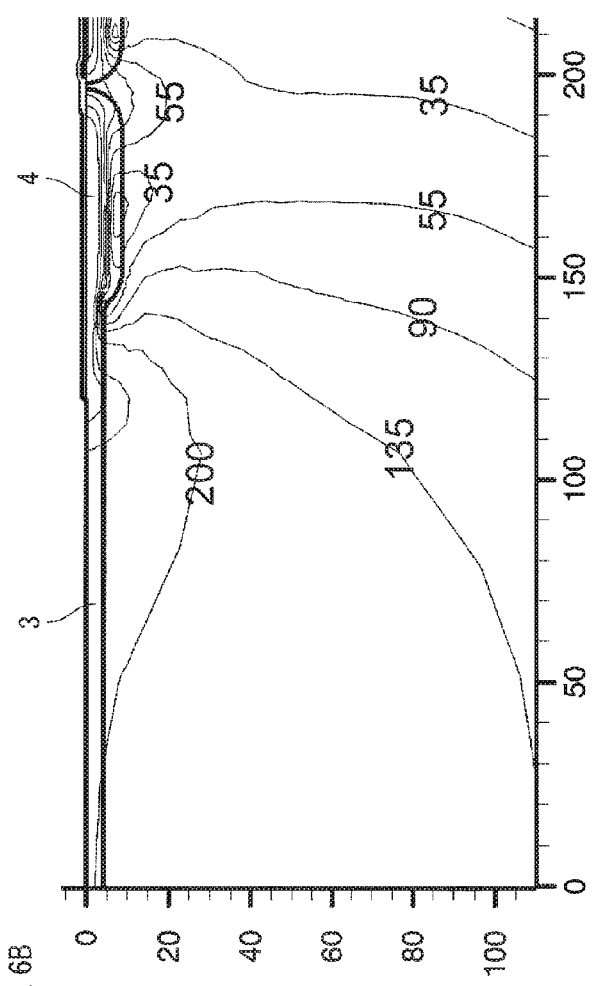

FIGS. 5A and 5B are views illustrating a hole current density distribution in an ON state, which is calculated by a simulation in a device structure of the semiconductor device according to the first embodiment. FIG. 5A is a cross-sectional view illustrating a profile of the distribution of hole current density at a position corresponding to FIG. 3. FIG. 5B is a cross-sectional view illustrating a profile of the distribution of hole current density in which a part of FIG. 5A is enlarged. FIGS. 6A and 6B are views illustrating a hole current density distribution in an ON state, which is calculated by a simulation in a device structure of the conventional semiconductor device, which does not have the Schottky electrode, with respect to the device structure of the semiconductor device 31 according to the first embodiment. FIG. 6A is a cross-sectional view illustrating a profile of the distribution of hole current density at a position corresponding to FIG. 3. FIG. 6B is a cross-sectional view illustrating a profile of the distribution of hole current density in which a part of FIG. 6A is enlarged. In FIG. 5 and FIG. 6, the same reference numerals are assigned to portions corresponding to those in FIG. 3 and FIG. 4. Numeric values illustrated in the drawings are current densities (A/cm$^2$).

When equicurrent-density lines of FIG. 5 and FIG. 6 are compared with each other, it is understood that the current density flowing to the contour-termination region 22 is decreased in the device structure (the semiconductor device 31 according to the first embodiment) including the Schottky electrode 8. With reference to FIG. 4, the reason of the decrease of the current density will be explained. While the anode electrode 12 ohmically contacted to the anode region 3 is forward biased, the Schottky electrode 8 is in a state of being applied with the reverse bias. Therefore, in the anode region 3 immediately below the extension portion 12b of the anode electrode 12, the holes are not injected from the anode region 3 immediately under the Schottky electrode 8 at the time of the forward bias supply, and the carrier injection into the contour-termination region 22 in the ON state is decreased more than that of the conventional device structure that does not include the Schottky electrode 8. That is to say, a hole current flowing to the contour-termination region 22 is decreased more than that of the conventional device structure that does not include the Schottky electrode 8.

FIGS. 7A and 7B are cross-sectional views illustrating impact ionization rate distributions at the time of the recovery, which are obtained by a simulation, in the device structure of the semiconductor device 31 according to the first embodiment. FIG. 7A is a cross-sectional view illustrating the profile of the distribution of the impact ionization rate at a position corresponding to FIG. 3. FIG. 7B is a cross-sectional distribution profile in which a part of FIG. 7A is enlarged. FIGS. 8A and 8B are cross-sectional views illustrating impact ionization rate distributions at the time of the recovery, which is obtained by a simulation, in the device structure of the conventional semiconductor device, which does not have the Schottky electrode, with respect to the device structure of the semiconductor device 31 according to the first embodiment. FIG. 8A is a cross-sectional view illustrating the profile of the distribution of the impact ionization rate at a position corresponding to FIG. 3. FIG. 8B is a cross-sectional view illustrating the profile of the distribution of the impact ionization rate in which a part of FIG. 8A is enlarged. The impact ionization rate is a value obtained by adding a product of a saturation velocity of the electrons, an electron concentration and an ionization coefficient of the electrons and a product of a saturation velocity of the holes, a hole concentration and an ionization coefficient of the holes to each other, and a unit of the impact ionization rate is represented by [cm$^{-3}$ s$^{-1}$]. Also in FIG. 7 and FIG. 8, the same reference numerals are assigned to portions corresponding to those in FIG. 3 and FIG. 4.

When current density portions of FIG. 7 and FIG. 8 are compared with each other, impact ionization rates in the portions equivalent to the outer curved surface portion 4a of the extraction region 4 in FIG. 4 are approximately 2×10$^{19}$ [cm$^{-3}$ s$^{-1}$] and 1×10$^{21}$ [cm$^{-3}$ s$^{-1}$] respectively. It is understood that the impact ionization rate of the device structure including the Schottky electrode 8 (that is, the semiconductor device according to the first embodiment) is smaller by double-digits than the device structure that does not include the Schottky electrode 8, and that the device structure including the Schottky electrode 8 is capable of decreasing the impact ionization. This is because, since a carrier injection amount into the contour-termination region 22 in the ON state is decreased, an amount of the carriers crowds to the outer curved surface portion 4a of the extraction region 4 at the time of the recovery is also decreased. Moreover, at the time of the reverse recovery, the Schottky electrode 8 functions to suck out the holes, and accordingly, the Schottky electrode 8 extracts the current flowing to the contour-termination region 22 side, and as heretofore, the anode electrode 12 sucks out the carriers accumulated in the active-element arrangement area 21 side. Accordingly, in the device structure including the Schottky electrode 8, the current concentration is relieved more than in the conventional structure that does not include the Schottky electrode 8.

Figure 9:
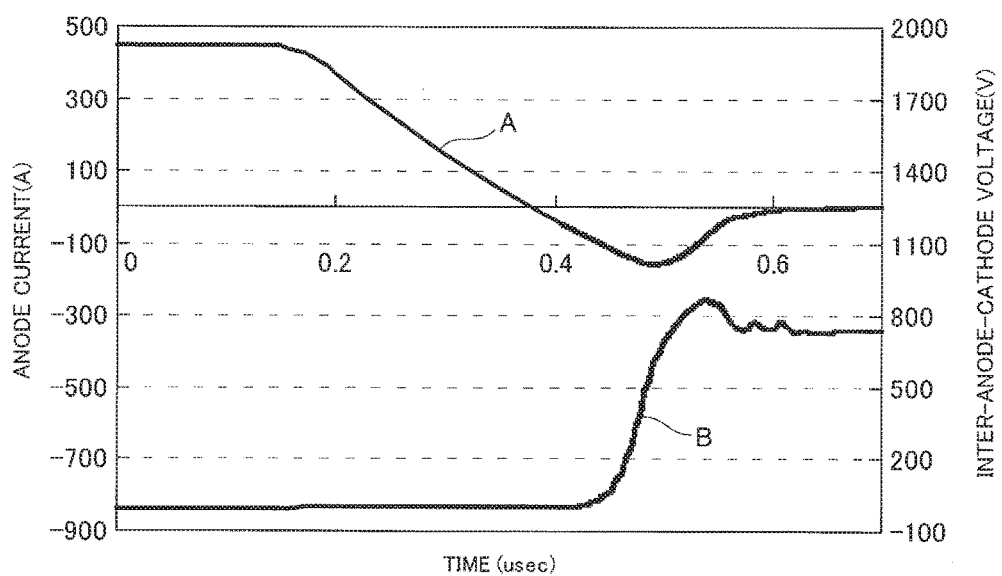
FIG. 9 is a graph illustrating waveforms at a time of reverse recovery in the semiconductor device according to the first embodiment of the present invention.

FIG. 9 is a graph illustrating a waveform at the time of the reverse recovery of the semiconductor device 31 according to the first embodiment. In FIG. 9, a waveform A illustrates the anode current, and a waveform B illustrates an inter-anode-cathode voltage (voltage across the anode and the cathode). Moreover, the waveform A and the waveform B are waveforms in a case of setting a width of the extraction region 4 to 10 μm and 150 μm, and the waveforms in both of the case where the width is 10 μm and the case where the width is 150 μm substantially overlap each other.

As understood from FIG. 9, even if the width of the extraction region 4 is narrowed by 140 μm from 150 μm to 10 μm, the waveform A and the waveform B at the time of the reverse recovery are hardly changed.

As described above, the semiconductor device 31 according to the first embodiment of the present invention includes the Schottky electrode 8, which is connected to the extension portion 12b of the anode electrode 12, and is Schottky-contacted to the anode region 3. The Schottky electrode 8 is provided between the anode region 3 and the extension portion 12b. Hence, in accordance with the semiconductor device 31 according to the first embodiment of the present invention, at the time of the forward bias, the holes are not injected from the anode region 3 immediately under the Schottky electrode 8, and the hole current flowing to the contour-termination region 22 side can be decreased in comparison with that of the conventional device structure that does not include the Schottky electrode 8. Moreover, at the time of reverse recovery, the Schottky electrode 8 functions to suck out the holes, and accordingly, the Schottky electrode 8 sucks out the current flowing to the contour-termination region 22 side, and as heretofore, the anode electrode 12 extracts the carriers accumulated in the active-element arrangement area 21 side. Accordingly, in the device structure including the Schottky electrode 8, the current concentration can be relieved more than in the conventional structure that does not include the Schottky electrode 8. As a result, the reverse-recovery immunity of the diode element 20 can be enhanced. Moreover, even if the width of the extraction region 4 is narrowed by 140 μm, the waveform A and the waveform B at the time of the reverse recovery are hardly changed. Accordingly, the distance to the end portion of the outer curved surface portion 4a of the extraction region 4 from the peripheral edge portion (peripheral edge portion of the contact hole 11) of the ohmic contact portion 12a of the anode electrode 12, in other words, from the end portion 10a of the insulating film 10, which serves as the end portion of the ohmic contact portion 12a, can be shorted. Therefore, the chip size can be minimized.

Moreover, as mentioned above, the semiconductor device 31 according to the first embodiment of the present invention includes the FLR regions $6_j$, $6_{j+1}$ and $6_{j+2}$, which are provided apart from the extraction region 4, at the position surrounding the anode region 3 and the extraction region 4 on the upper surface of the drift layer 1. The FLR regions $6_j$, $6_{j+1}$ and $6_{j+2}$ can relax the electric field density in the outer curved surface portion 4a of the extraction region 4. Hence, in accordance with the semiconductor device 31 according to the first embodiment of the present invention, the Schottky electrode 8 and the FLR regions $6_j$, $6_{j+1}$ and $6_{j+2}$ are combined with each other, whereby the reverse-recovery immunity of the diode element 20 can be further enhanced.

Moreover, as mentioned above, the semiconductor device 31 according to the first embodiment of the present invention includes the extraction region 4, which is provided in contact with the anode region 3 so as to surround the anode region 3, and is disposed deeper than the anode region 3. With regard to the extraction region 4, a curvature of the outer curved surface portion 4a is increased in comparison with the case where the extraction region 4 is disposed at a depth similar to that of the anode region 3. Accordingly, the electric field density in the outer curved surface portion 4a can be relaxed. Hence, in accordance with the semiconductor device according to the first embodiment of the present invention, the Schottky electrode 8 and the extraction region 4 are combined with each other, whereby the reverse-recovery immunity of the diode element 20 can be further enhanced.

Moreover, as mentioned above, the semiconductor device 31 of the first embodiment of the present invention adopts such a separation structure in which the outer curved surface portion 4a of the extraction region 4 is spaced apart from the peripheral edge portion of the ohmic contact portion 12a of the anode electrode 12. This separation structure can relieve the current concentration onto the peripheral edge portion of the ohmic contact portion 12a of the anode electrode 12. Hence, in accordance with the semiconductor device 31 according to the first embodiment of the present invention, the Schottky electrode 8 and the separation structure are combined with each other, whereby the reverse-recovery immunity of the diode element 20 can be further enhanced.

Note that, in the above-mentioned first embodiment, the description is made of the case where the extraction region 4 is provided in contact with the anode region 3 at the position surrounding the anode region 3. However, it is not necessarily necessary to provide the extraction region 4. Also in this case, the effects brought by the Schottky electrode 8 can be exerted.

Moreover, in the above-mentioned first embodiment, the description is made of the case where the Schottky electrode 8 is made by a Pt film. However, for example, the Schottky electrode 8 may be made by a composite film of a titanium (Ti) film, which is Schottky-barrier contacted to the anode region 3, and of a titanium nitride (TiN) film provided on the Ti film.

Moreover, in the above-mentioned first embodiment, the description is made of the case where the Schottky electrode 8 is ohmically contacted continuously with the anode region 3 so as to surround the ohmic contact portion 12a of the anode electrode 12. However, the Schottky electrode 8 may be periodically contacted to the anode region 3 so that a plurality of pieces of the Schottky electrode 8 can be dotted at the position surrounding the ohmic contact portion 12a of the anode electrode 12.

Second Embodiment

A semiconductor device 32 according to the second embodiment of the present invention has a substantially similar configuration to that of the semiconductor device 31 according to the above-mentioned first embodiment. However, the semiconductor device 32 is different from the semiconductor device 31 in the disposition of the Schottky electrode.

Figure 12:
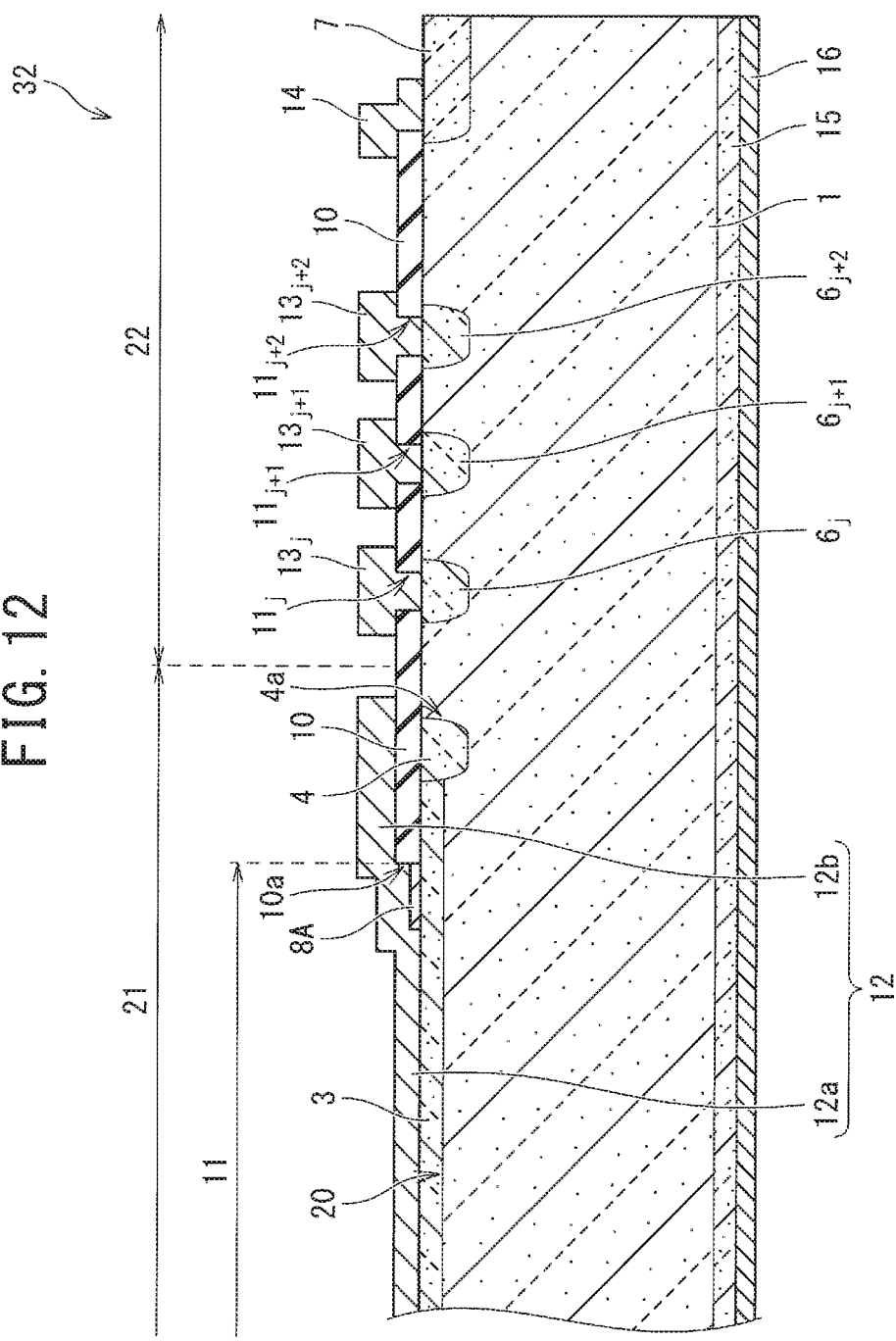
FIG. 12 is a main portion cross-sectional view illustrating a cross-sectional structure taken along a line in FIG. 10.

As illustrated in FIG. 12, the semiconductor device 32 according to the second embodiment of the present invention includes a drift layer 1, a p-type anode region 3 selectively provided on the drift layer 1, and an insulating film 10 provided on the drift layer 1. Moreover, the semiconductor device 32 according to the second embodiment includes an anode electrode 12 having an ohmic contact portion 12a and an extension portion 12b. The ohmic contact portion 12a is ohmically contacted to the anode region 3 through a contact hole 11 that penetrates the insulating film 10. The extension portion 12b is pulled out from the ohmic contact portion 12a to the periphery of the ohmic contact portion 12a.

Furthermore, as illustrated in FIG. 12, the semiconductor device 32 according to the second embodiment includes a Schottky electrode 8A Schottky-contacted to a peripheral portion of the anode region 3. Moreover, the semiconductor device 32 according to the second embodiment includes a p$^+$-type extraction region 4, which is provided in contact with the anode region 3 at the position surrounding the anode region 3, and is disposed deeper than the anode region 3.

Moreover, the semiconductor device 32 according to the second embodiment includes an n$^+$-type cathode region 15 and a cathode electrode 16. The n$^+$-type cathode region 15 is provided under a back surface side of the drift layer 1 so as to cover an active-element arrangement area 21 and a contour-termination region 22. The cathode electrode 16 is provided on the back surface of the drift layer 1 so as to cover the active-element arrangement area 21 and the contour-termination region 22. Furthermore, the semiconductor device 32 according to the second embodiment includes a diode element 20 established in the active-element arrangement area 21, and triple FLR regions $6_j$, $6_{j+1}$ and $6_{j+2}$, which are provided in the contour-termination region 22.

As illustrated in FIG. 12, in a similar way to the Schottky electrode 8 according to the above-mentioned first embodiment, the Schottky electrode 8A is disposed between the anode region 3 and the extension portion 12b of the anode electrode 12 so as to be connected to the extension portion 12b of the anode electrode 12. Moreover, the Schottky electrode 8A is electrically and metallurgically connected to the extension portion 12b of the anode electrode 12. Furthermore, the Schottky electrode 8A is implemented by the annular plane pattern extending annularly so as to surround the ohmic contact portion 12a of the anode electrode 12. Moreover, the Schottky electrode 8A is made, for example, by a Pt film.

Although not illustrated in detail, for example, the Schottky electrode 8A extends continuously on the anode region 3 so as to surround the ohmic contact portion 12a of the anode electrode 12 and is ohmically contacted to the anode region 3 continuously in a similar way to the Schottky electrode 8 according to the above-mentioned first embodiment.

Figure 10:
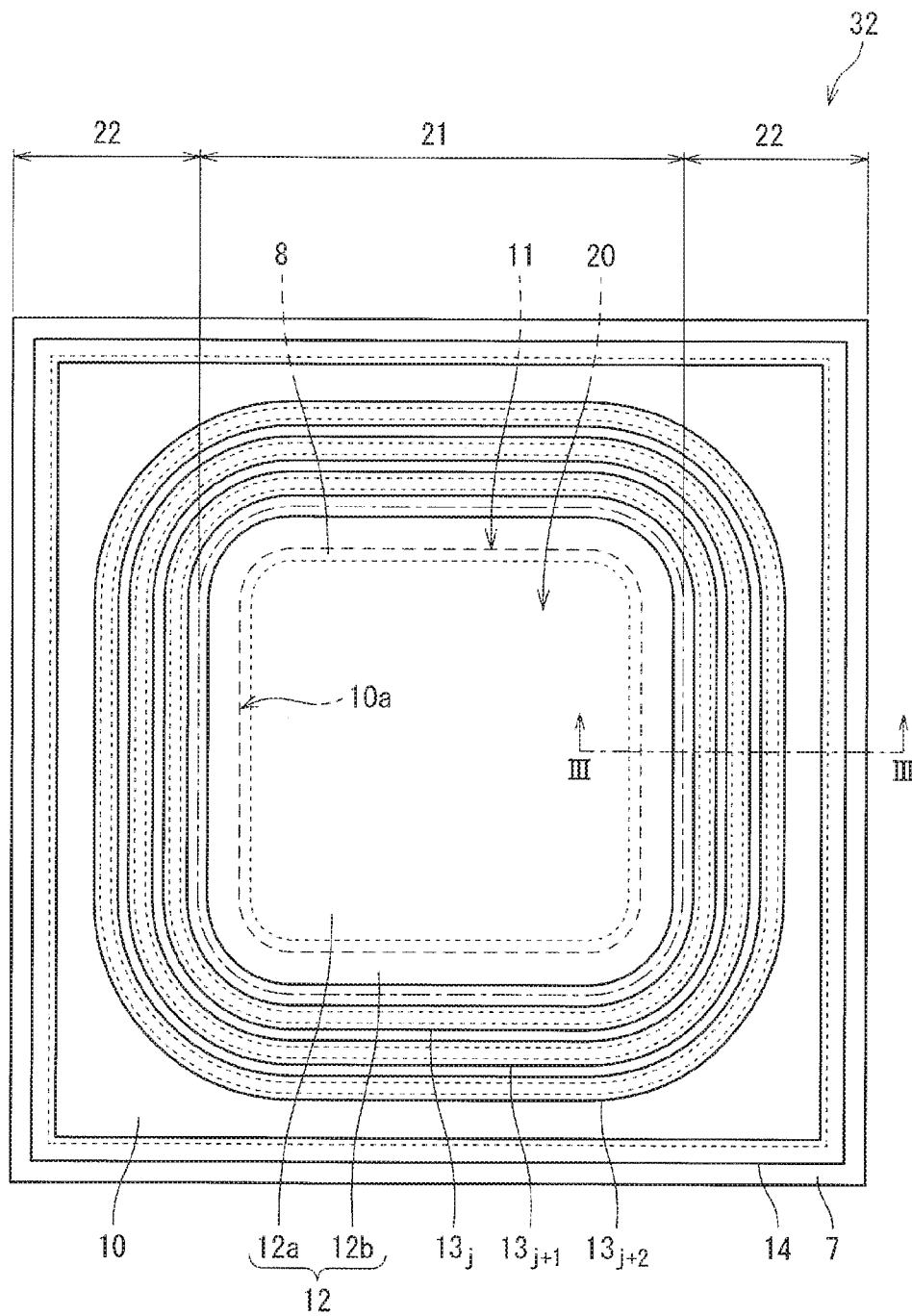
FIG. 10 is a chip layout view of a semiconductor device according to a second embodiment of the present invention.
Figure 11:
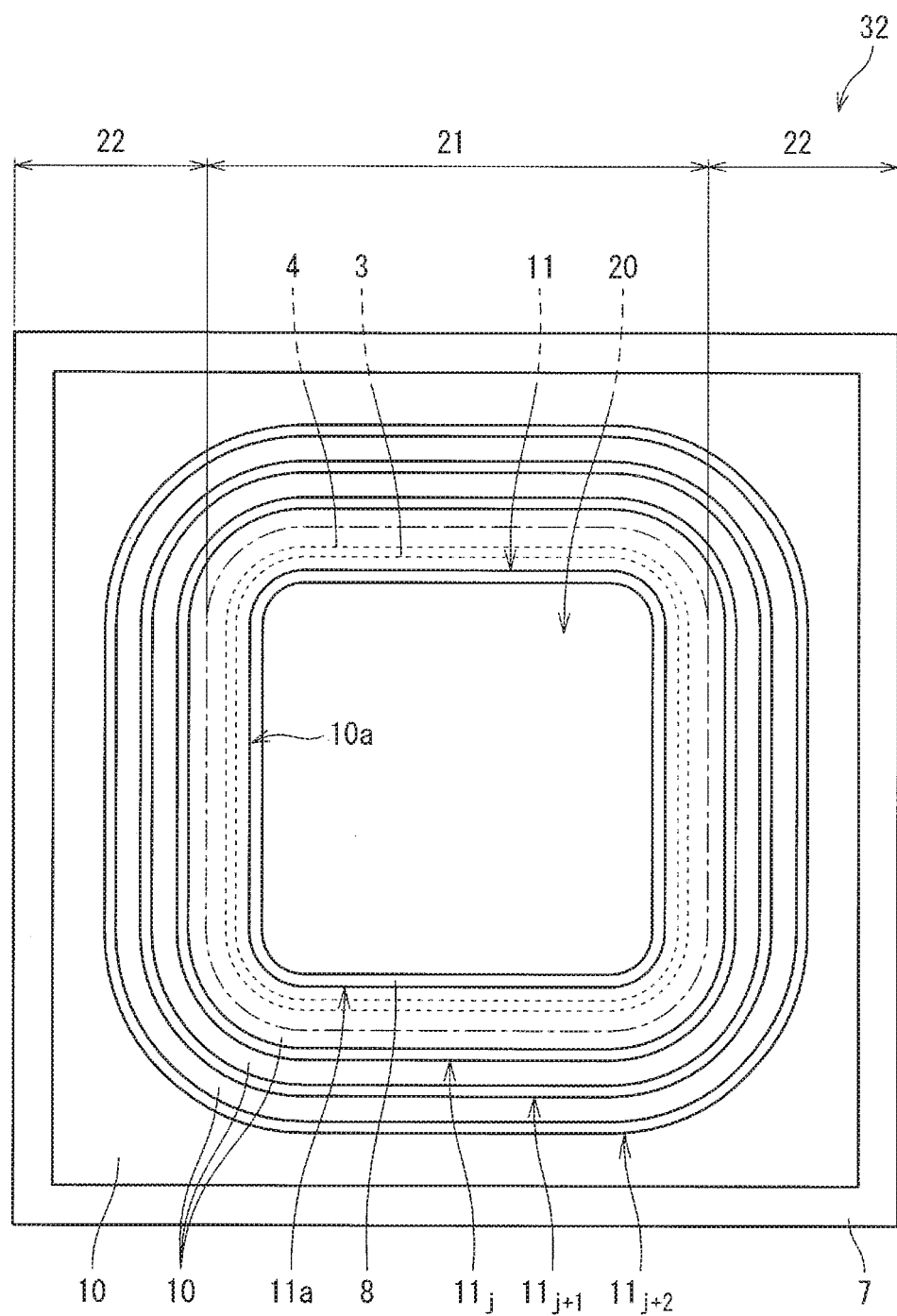
FIG. 11 is a chip layout view in a state where illustration of an anode electrode and an FLR electrode, which are illustrated in FIG. 10, is omitted.

As illustrated in FIG. 3, the semiconductor device 31 according to the above-mentioned first embodiment has a configuration in which the Schottky electrode 8 is embedded in the inside of the through hole 11a that penetrates the insulating film 10 apart from the contact hole 11. In contrast, as illustrated in FIG. 10 to FIG. 12, the semiconductor device 32 according to the second embodiment has a configuration in which the Schottky electrode 8A is disposed in the peripheral edge portion in the inside of the contact hole 11 so as to be brought into contact with the end portion 10a of the insulating film 10.

The semiconductor device 32 according to the second embodiment, which is configured as described above, also includes the Schottky electrode 8A Schottky-contacted to the peripheral portion of the anode region 3. Accordingly, the reverse-recovery immunity of the diode element 20 can be enhanced in a similar way to the semiconductor device 31 according to the above-mentioned first embodiment.

Moreover, the Schottky electrode 8A is disposed on the peripheral edge portion in the inside of the contact hole 11, and accordingly, it becomes possible to decrease the carriers flowing from the anode region 3 to the edge side at the time of the forward bias. Therefore, the current concentrated onto such an active portion and the Schottky electrode 8A at the time of the reverse recovery can be suppressed.

Note that, also in the above-mentioned second embodiment, it is not necessarily necessary to provide the extraction region 4. Also in this case, the effects brought by the Schottky electrode 8A can be exerted.

Moreover, also in the above-mentioned second embodiment, the Schottky electrode 8A may be made, for example, by the composite film of the Ti film, which is Schottky-contacted to the anode region 3, and of the TiN film provided on the Ti film.

Moreover, also in the above-mentioned second embodiment, the Schottky electrode 8A may be periodically contacted to the anode region 3 so that a plurality of pieces of the Schottky electrode 8A can be dotted at the position surrounding the ohmic contact portion 12a of the anode electrode 12.

Third Embodiment

A semiconductor device 33 according to the third embodiment of the present invention has a substantially similar configuration to that of the semiconductor device 32 according to the second embodiment. However, the semiconductor device is different from the semiconductor device 32 in a semiconductor region Schottky-contacted to a Schottky electrode.

Figure 13:
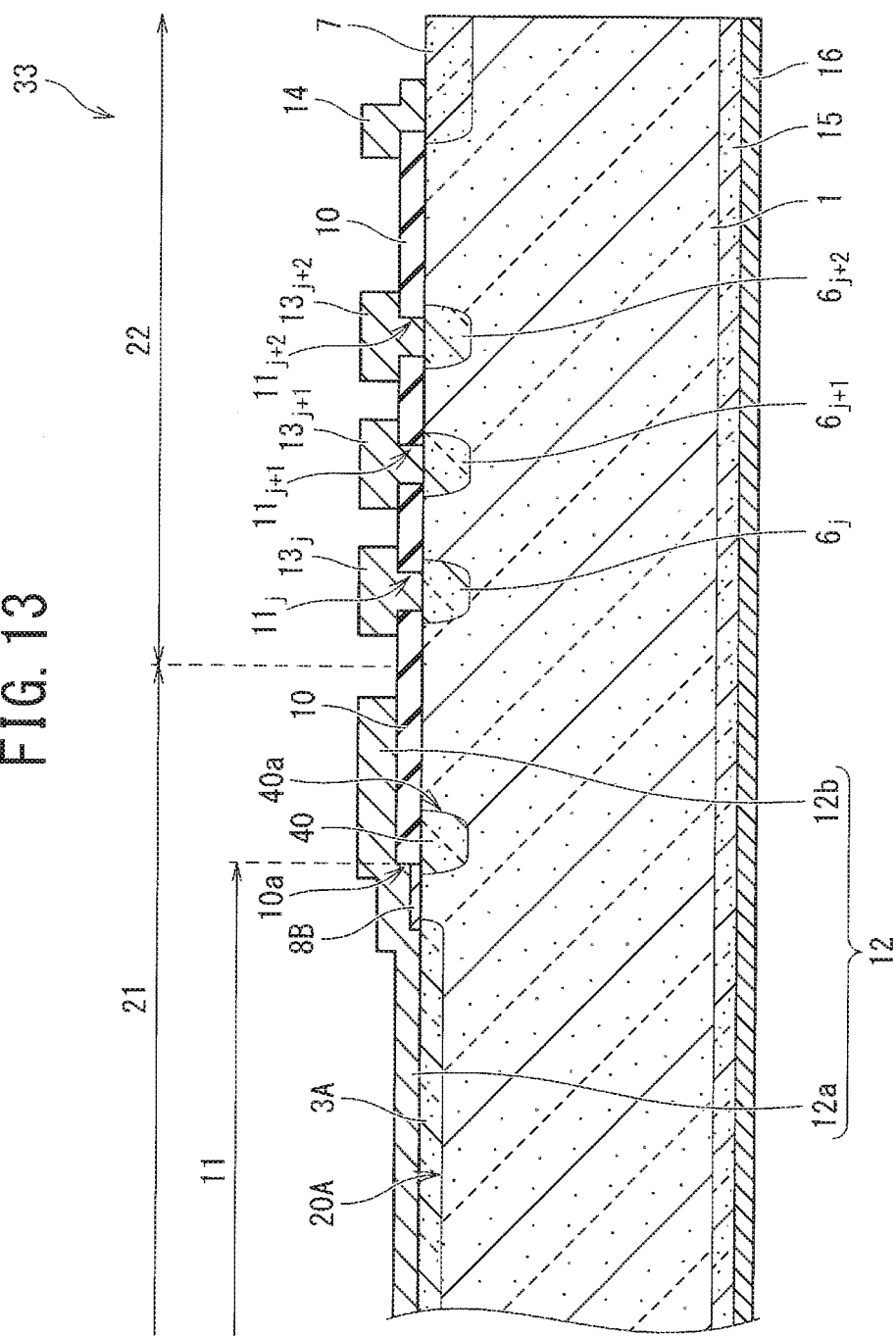
FIG. 13 is a main portion cross-sectional view illustrating a cross-sectional structure of a semiconductor device according to a third embodiment of the present invention.

As illustrated in FIG. 13, the semiconductor device 33 according to the third embodiment of the present invention includes a drift layer 1, a p-type anode region 3A selectively provided on an upper surface side of the drift layer 1, and an insulating film 10 provided on the drift layer 1.

Moreover, as illustrated in FIG. 13, the semiconductor device 33 according to the third embodiment includes an anode electrode 12 having an ohmic contact portion 12a and an extension portion 12b. The ohmic contact portion 12a is ohmically contacted to the anode region 3A through a contact hole 11 that penetrates the insulating film 10. The extension portion 12b is pulled out from the ohmic contact portion 12a to a periphery of the ohmic contact portion 12a.

Moreover, as illustrated in FIG. 13, the semiconductor device 33 according to the third embodiment includes a Schottky electrode 8B Schottky-contacted to a peripheral portion of the anode region 3A. Moreover, the semiconductor device 33 according to the third embodiment includes a p$^+$-type extraction region 40, which is provided apart from the anode region 3A at the position surrounding the anode region 3A, and is disposed deeper than the anode region 3A.

Moreover, as illustrated in FIG. 13, the semiconductor device 33 according to the third embodiment includes an n$^+$-type cathode region 15 and a cathode electrode 16. The cathode region 15 is provided under the back surface side of the drift layer 1 so as to cover an active-element arrangement area 21 and a contour-termination region 22. The cathode electrode 16 is provided on the back surface of the drift layer 1 so as to cover the active-element arrangement area 21 and the contour-termination region 22. Furthermore, the semiconductor device 33 according to the third embodiment includes a diode element 20A established in the active-element arrangement area 21, and triple FLR regions $6_j$, $6_{j+1}$ and $6_{j+2}$, which are provided in the contour-termination region 22. The diode element 20A mainly includes the drift layer 1, the anode region 3A and the cathode region 15, which are mentioned above.

The anode region 3A is implemented by a square plane pattern in a similar way to the anode region 3 according to the above-mentioned first and second embodiments. Moreover, unlike the anode region 3 according to the above-mentioned first and second embodiments, the anode region 3A is embedded in the inside of the contact hole 11 so as to be spaced apart from a peripheral edge portion of the contact hole 11 (that is, the end portion 10a of the insulating film 10).

The Schottky electrode 8B is disposed between the extension portion 12b of the anode electrode 12 and each of the anode region 3A, the drift layer 1 and the extraction region 40 so as to be connected to the extension portion 12b of the anode electrode 12. Moreover, the Schottky electrode 8B is electrically and metallurgically connected to the extension portion 12b of the anode electrode 12. Furthermore, the Schottky electrode 8B is implemented by the annular plane pattern extending annularly so as to surround the ohmic contact portion 12a of the anode electrode 12. Moreover, the Schottky electrode 8B is provided on the peripheral edge portion of the inside of the contact hole 11 so as to be brought into contact with the end portion 10a of the insulating film 10. Moreover, the Schottky electrode 8B extends continuously on the anode region 3A, the drift layer 1 and the extraction region 40, for example, so as to surround the ohmic contact portion 12a of the anode electrode 12, and is ohmically contacted continuously to each of the anode region 3A, the drift layer 1 and the extraction region 40. Moreover, the Schottky electrode 8B is made, for example, by a Pt film.

The extraction region 40 is established in a similar way to the extraction region 4 according to the above-mentioned first and second embodiments. That is to say, the extraction region 40 is delineated as an annular plane pattern extending annularly so as to surround the anode region 3A. Moreover, a surface carrier concentration of the extraction region 40 is made higher than a surface carrier concentration of the anode region 3A. Furthermore, in the extraction region 40, a curvature of an outer curved surface portion 40a is increased in comparison with a case where the extraction region 40 is disposed at a depth similar to that of the anode region 3A.

As illustrated in FIG. 12, the semiconductor device 32 according to the above-mentioned second embodiment has a configuration in which the anode region 3 is provided to cover the area from the portion immediately under the ohmic contact portion 12a of the anode electrode 12 to the portion immediately below the extension portion 12b of the anode electrode 12. That is to say, the anode region 3 is provided to cover the inside and outside of the contact hole 11. In contrast, as illustrated FIG. 13, the semiconductor device 33 according to the third embodiment has a configuration in which the anode region 3A is embedded in the inside of the contact hole 11 so as to be spaced apart from the peripheral edge portion of the contact hole 11 (that is, from the end portion 10a of the insulating film 10).

Moreover, as illustrated in FIG. 12, the semiconductor device 32 according to the above-mentioned second embodiment has a configuration in which the extraction region 4 is provided in contact with the anode region 3 at the position surrounding the anode region 3. In contrast, as illustrated in FIG. 13, the semiconductor device 33 according to the third embodiment has a configuration in which the extraction region 40 is provided apart from the anode region 3A at the position surrounding the anode region 3A.

Moreover, as illustrated in FIG. 12, the semiconductor device 32 according to the above-mentioned second embodiment has a configuration in which the Schottky electrode 8A is Schottky-contacted only to the anode region 3. In contrast, as illustrated in FIG. 13, the semiconductor device 33 according to the third embodiment has a configuration in which the Schottky electrode 8B is Schottky-contacted to each of the anode region 3A, the drift layer 1 and the extraction region 40.

The semiconductor device 33 according to the third embodiment, which is configured as described above, also includes the Schottky electrode 8B Schottky-contacted to the peripheral portion of the anode region 3A. Accordingly, the reverse-recovery immunity of the diode element 20A can be enhanced in a similar way to the semiconductor device 31 according to the above-mentioned first embodiment.

Moreover, the Schottky electrode 8B has a configuration of being Schottky-contacted to each of the anode region 3A, the drift layer 1 and the extraction region 40. Accordingly, the carriers can be effectively extracted from the drift layer 1.

Note that, also in the above-mentioned third embodiment, it is not necessarily necessary to provide the extraction region 40. Also in this case, the effects brought by the Schottky electrode 8B can be exerted.

Moreover, also in the above-mentioned third embodiment, the Schottky electrode 8B may be made, for example, by the composite film of the Ti film, which is Schottky-contacted to the anode region 3A, and of the TiN film provided on the Ti film.

Moreover, also in the above-mentioned third embodiment, the Schottky electrode 8B may be periodically joined to each of the anode region 3A, the drift layer 1 and the extraction region 40 so that a plurality of pieces of the Schottky electrode 8B can be dotted at the position surrounding the ohmic contact portion 12a of the anode electrode 12.

Fourth Embodiment

A semiconductor device 34 according to the fourth embodiment of the present invention has a substantially similar configuration to that of the semiconductor device 33 according to the third embodiment. However, the semiconductor device is different from the semiconductor device 33 in a semiconductor region Schottky-contacted to a Schottky electrode.

Figure 14:
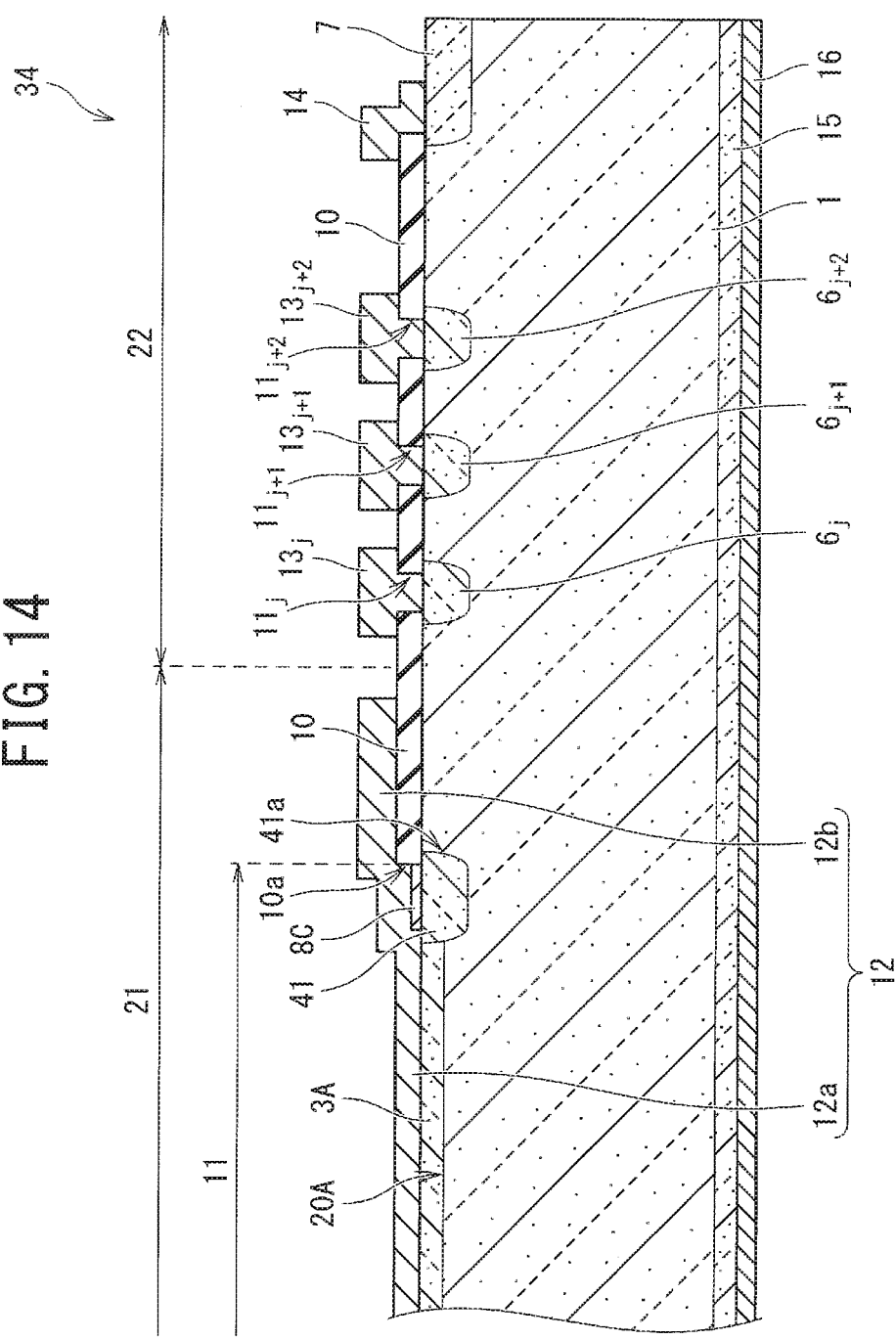
FIG. 14 is a main portion cross-sectional view illustrating a cross-sectional structure of a semiconductor device according to a fourth embodiment of the present invention.

As illustrated in FIG. 14, the semiconductor device 34 according to the fourth embodiment of the present invention includes a drift layer 1, a p-type anode region 3A selectively provided on the upper surface side of the drift layer 1, and an insulating film 10 provided on the drift layer 1.

Moreover, as illustrated in FIG. 14, the semiconductor device 34 according to the fourth embodiment includes an anode electrode 12 having an ohmic contact portion 12a and an extension portion 12b. The ohmic contact portion 12a is ohmically contacted to the anode region 3A through a contact hole 11 that penetrates the insulating film 10. The extension portion 12b is pulled out from the ohmic contact portion 12a to a periphery of the ohmic contact portion 12a.

As illustrated in FIG. 14, the semiconductor device 34 according to the fourth embodiment includes a $p^+$-type extraction region 41, which is provided in contact with the anode region 3A at the position surrounding the anode region 3A, and is disposed deeper than the anode region 3A. Moreover, the semiconductor device 34 according to the fourth embodiment includes a Schottky electrode 8C Schottky-contacted to the extraction region 41.

Moreover, as illustrated in FIG. 14, the semiconductor device 33 according to the fourth embodiment includes a $n^+$-type cathode region 15 and a cathode electrode 16. The cathode region 15 is provided under a back surface side of the drift layer 1 so as to cover an active-element arrangement area 21 and a contour-termination region 22. The cathode electrode 16 is provided on the back surface of the drift layer 1 so as to cover the active-element arrangement area 21 and the contour-termination region 22. Furthermore, the semiconductor device 34 according to the fourth embodiment includes a diode element 20A established in the active-element arrangement area 21, and triple FLR regions $6_j$, $6_{j+1}$ and $6_{j+2}$, which are provided in the contour-termination region 22.

The Schottky electrode 8C is disposed between the extraction region 41 and the extension portion 12b of the anode electrode 12 so as to be connected to the extension portion 12b of the anode electrode 12. Moreover, the Schottky electrode 8C is electrically and metallurgically connected to the extension portion 12b of the anode electrode 12. Furthermore, the Schottky electrode 8C is implemented by the annular plane pattern extending annularly so as to surround the ohmic contact portion 12a of the anode electrode 12. Moreover, the Schottky electrode 8C is provided on a peripheral edge portion of the inside of the contact hole 11 so as to be brought into contact with the end portion 10a of the insulating film 10. Moreover, the Schottky electrode 8C extends continuously on the extraction region 41, for example, so as to surround the ohmic contact portion 12a of the anode electrode 12, and is ohmically contacted continuously to the extraction region 41. The Schottky electrode 8C is made, for example, by a Pt film.

The extraction region 41 is implemented by the annular plane pattern extending annularly so as to surround the anode region 3A. Moreover, a surface carrier concentration of the extraction region 41 is made higher than a surface carrier concentration of the anode region 3A. Furthermore, in the extraction region 41, a curvature of an outer curved surface portion 41a is increased in comparison with a case where the extraction region 41 is disposed at a depth similar to that of the anode region 3A.

The semiconductor device 34 according to the fourth embodiment, which is configured as described above, includes: the extraction region 41, which is provided in contact with the anode region 3A at the position surrounding the anode region 3A, and is disposed deeper than the anode region 3A; and the Schottky electrode 8C Schottky-contacted to the extraction region 41. Accordingly, the reverse-recovery immunity of the diode element 20A can be enhanced in a similar way to the semiconductor device 31 according to the above-mentioned first embodiment.

Note that, also in the above-mentioned fourth embodiment, the Schottky electrode 8C may be made, for example, by the composite film of the Ti film, which is Schottky-contacted to the extraction region 41, and of the TiN film provided on the Ti film.

Moreover, also in the above-mentioned fourth embodiment, the Schottky electrode 8C may be periodically joined to the extraction region 41 so that a plurality of pieces of the Schottky electrode 8C can be dotted at the position surrounding the ohmic contact portion 12a of the anode electrode 12.

The specific description is made above of the present invention based on the above-mentioned embodiments. However, the present invention is not limited to the above-mentioned embodiments, and as a matter of course, the present invention is modifiable in various ways within the scope without departing from the spirit thereof.

For example, in each of the above-mentioned first to fourth embodiments, one anode region 3 or 3A is provided in the active-element arrangement area 21. However, a plurality of the anode regions 3 or 3A may be provided in the active-element arrangement area 21 in a dotted manner.

As described above, the semiconductor device according to the present invention can enhance the reverse-recovery immunity of the diode element. The semiconductor device according to the present invention is useful for the semiconductor device such as a power device and a power IC, which includes the power diode element.

What is claimed is:

1. A semiconductor device comprising:
   a first conductivity-type drift layer;
   a second conductivity-type anode region provided in an upper portion of the drift layer;
   an insulating film provided on the drift layer;
   an anode electrode including an ohmic contact portion ohmically contacted to a first portion of the anode region through a contact hole penetrating the insulating film; and
   a Schottky electrode provided outside of the ohmic contact portion so as to surround the ohmic contact portion, the Schottky electrode being contacted to the anode electrode, and Schottky-contacted to a peripheral portion of the anode region surrounding the first portion of the anode region,
   wherein a Schottky barrier height at a Schottky junction between the Schottky electrode and the anode region is higher than a barrier height at an ohmic contact between the ohmic contact portion and the anode region.

2. The semiconductor device according to claim 1, wherein the anode electrode further includes an extension portion configured to pull out electrical path from the ohmic contact portion to a periphery of the ohmic contact portion,
   wherein the Schottky electrode is connected to the extension portion.

3. The semiconductor device according to claim 2, wherein the Schottky electrode is embedded in a through hole that penetrates the insulating film apart from the contact hole.

4. The semiconductor device according to claim 3, further comprising an extraction region contacted with the anode region, surrounding the anode region and being disposed deeper than the anode region.

5. The semiconductor device according to claim 3, further comprising a first conductivity-type cathode region provided under the drift layer.

6. The semiconductor device according to claim 4, wherein the extraction region is disposed immediately below the extension portion apart from the Schottky electrode.

7. The semiconductor device according to claim 4, further comprising a second conductivity-type field limiting ring region provided apart from the extraction region so as to surround the extraction region, in an upper portion of the drift layer.

8. The semiconductor device according to claim 2, wherein the Schottky electrode is embedded in the contact hole.

9. The semiconductor device according to claim 8, further comprising an extraction region contacted with the anode region, surrounding the anode region and being disposed deeper than the anode region.

10. The semiconductor device according to claim 8, further comprising a second conductivity-type extraction region provided apart from the anode region, surrounding the anode region and being disposed deeper than the anode region, wherein the Schottky electrode is Schottky-contacted to the drift layer and the extraction region.

11. The semiconductor device according to claim 9, wherein the extraction region is disposed immediately below the extension portion apart from the Schottky electrode.

12. The semiconductor device according to claim 9, further comprising a second conductivity-type field limiting ring region provided apart from the extraction region so as to surround the extraction region, in an upper portion of the drift layer.

13. The semiconductor device according to claim 10, further comprising: a second conductivity-type field limiting ring region provided apart from the extraction region so as to surround the extraction region, in an upper portion of the drift layer.

14. The semiconductor device according to claim 8, further comprising a first conductivity-type cathode region provided under the drift layer.

15. A semiconductor device comprising:
a first conductivity-type drift layer;
a second conductivity-type anode region provided in an upper portion of the drift layer;
an insulating film provided on the drift layer;
an anode electrode including an ohmic contact portion ohmically contacted to the anode region through a contact hole penetrating the insulating film;
a second conductivity-type extraction region provided in contact with the anode region, surrounding the anode region and being disposed deeper than the anode region; and
a Schottky electrode provided outside of the ohmic contact portion so as to surround the ohmic contact portion, the Schottky electrode being contacted to the anode electrode, and Schottky-contacted to the extraction region,
wherein a Schottky barrier height at a Schottky junction between the Schottky electrode and the anode region is higher than a barrier height at an ohmic contact between the ohmic contact portion and the anode region.

16. The semiconductor device according to claim 15, the anode electrode further includes an extension portion configured to pull out electrical path from the ohmic contact portion to a periphery of the ohmic contact portion,
wherein the Schottky electrode is connected to the extension portion.

17. The semiconductor device according to claim 16, wherein the Schottky electrode is embedded in the contact hole.

* * * * *